March 3, 1970 R. W. WILSON 3,498,832

MATERIAL AND METHOD FOR PRODUCING CERMET RESISTORS

Filed March 16, 1967

INVENTOR.
Richard W. Wilson

BY

[signature]

ATTY'S.

United States Patent Office 3,498,832
Patented Mar. 3, 1970

3,498,832
MATERIAL AND METHOD FOR PRODUCING CERMET RESISTORS

Richard W. Wilson, Phoenix, Ariz., assignor to Motorola, Inc., Franklin Park, Ill., a corporation of Illinois Filed Mar. 16, 1967, Ser. No. 623,623
Int. Cl. H01c *13/00*
U.S. Cl. 117—201 3 Claims

ABSTRACT OF THE DISCLOSURE

A thin film "cerment" resistor prepared by vacuum flash evaporation of a mixture of chromium silicide, tantalum silicide and aluminum oxide to deposit a resistance film on a dielectric substrate. Such films have a sheet resistance ranging from 1000 ohms per square up to 10,000 ohms per square, depending primarily upon the ratio of aluminum oixde to the other two ingredients. The temperature coefficient of resistance for a 5000 ohms per square film, for example, is −100 parts per million per degree centigrade. The resistor is particularly suited for use in integrated circuits and is shown to be compatible with diffused active circuit components of silicon wafer devices.

Background of the invention

Figure 1:
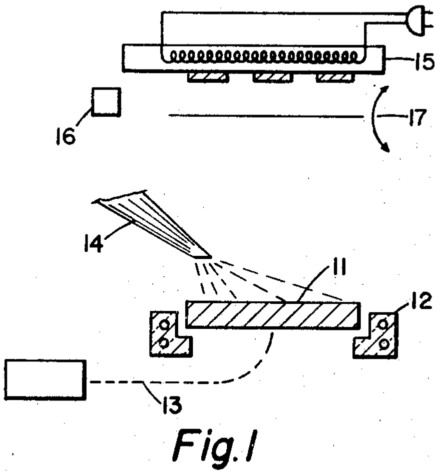

This invention relates to the fabrication of thin film resistors, and is directed primarily to integrated circuits comprising semiconductor structures in combination with thin film resistors.

In the development of high resistance thin film resistors for integration into monolithic semiconductor structures, there are at least four compatibility restraints that must be met. First, the resistor film must adhere well to silicon dioxide glass and be compatible therewith. Second, the composition must be compatible with aluminum, since aluminum is generally employed to make ohmic contacts to the active circuit components of the integrated structure. Third, the film must be amenable to configuration by photoresist and etching techniques. Fourth, the resistor film and associated connecting conductors must be able to withstand a high temperature reliability test without degradation, for example, one-half hour at 450° C. in an oxygen-bearing atmosphere.

In general, the fabrication of a thin film resistor for hybrid circuits has involved the deposition of a metal or a semiconducting oxide on an insulating substrate. For a monolithic integrated circuit, such a metal or oxide film is usually deposited directly upon the silicon dioxide layer covering the semiconductor wafer into which one or more active circuit components are previously fabricated, for example, by diffusion techniques.

The desired geometry of the thin film material is achieved by means of masked etching. Another insulating layer is then deposited over the resistor, followed by etching to provide apertures for ohmic contacts. The contact metal is generally evaporated over the insulating layer and through the apertures onto the resistor element. The contact metal is then removed from all but the desired areas by means of masked etching.

A number of materials have been available for use in the fabrication of thin film resistors. For example, tin oxide films have been used to provide films having sheet resistance values ranging from 80 to 4000 ohms per square, obtained by doping the film with varying amounts of indium or antimony during the deposition process. The temperature coefficient of resistivity for such films ranges to −1500 parts per million per degree centigrade.

Tantalum film resistors have been deposited by sputtering techniques, but have not been found satisfactory or adequate for many purposes. Vacuum evaporated chromium films adhere well to metals and to glass but they have a poor temperature coefficient and resistivity.

A Nichrome alloy of nickel and chromium has been found suitable for thin film resistor fabrication, but only in the limited range of 10 to 400 ohms per square, depending on film thickener.

Therefore, a continuing need exists for the development of thin film compositions providing a high value of sheet resistance, and an acceptably low temperature coefficient of resistance. It is especially desirable that a composition be flexible in its ability to provide a wide range of sheet resistance values without depending primarily on film thickness to provide such flexibility.

Summary of the invention

Accordingly, it is an object of the present invention to provide a thin film resistor having a composition satisfying all the above compatibility requirements.

It is a further object of the invention to provide a thin film resistor composition comprising two or more constituents useful throughout a wide range of proportions to provide a correspondingly wide range of sheet resistance values.

It is a further object of the invention to provide an improved technique of vacuum flash evaporation to deposit such resistor compositions.

It is a feature of the invention to prepare a thin film resistor comprising a chromium silicide.

It is also a feature of the invention to prepare a thin film resistance element comprising a chromium silicide and a tantalum silicide.

The invention is embodied in an electrical resistance composition and structure comprising a dielectric substrate coated with a thin film composition containing a chromium silicide, a tantalum silicide and aluminum oxide. For certain limited applications either the aluminum oxide or the tantalum silicide, or both, may be omitted from the composition. Generally, however, all three ingredients are included.

The thin film resistance compositions of the invention are deposited upon a dielectric substrate by means of electron beam vacuum flash evaporation. Vacuum evaporation is typically used for the deposition of many types of thin films. Generally, a tungsten filament is brought to a high temperature in a high vacuum, and the material to be evaporated is then brought in contact with the filament.

The mean free path of the evaporated molecules, or atoms, is much greater in a high vacuum (usually $10^{-6}$ or $10^{-5}$ torr) than could be expected in a normal atmospheric environment. Hence, the evaporated material radiates in all directions from the source.

The substrate, which is usually heated during evaporation to promote adhesion and to control the film structure, is generally placed several inches from the source. The effective substrate temperature, primarily determined by a substrate heater, is modified by radiant energy from the heater and the kinetic energy of the impinging particles.

It is known that an electron beam may advantageously be substituted for the tungsten filament as a means of heating and vaporizing the source material, in the event a highly refractory substance is to be vaporized and deposited. The conventional approach is to impinge the electron beam directly upon the source material. However, it was found that when the refractory powders of the present invention were passed through the beam, the power supply became very erratic due to excessive sparking and arcing in the powder stream. In some instances the powder particles were propelled directly to the substrate, where they became entrapped with the deposited film. Therefore, in accordance with one embodiment of the invention the electron beam source is located below the crucible, and the electron beam is directed to the lower side of the crucible, while the powder is passed in contact with the upper side of the crucible. Greatly improved operation of the electron gun and power supply result from this arrangement. Also, evaporation of the powders occurs more efficiently and is more readily controlled to obtain a specific sheet resistance value.

Chromium forms at least three silicides; namely, $Cr_3Si_2$, $Cr_3Si$ and $CrSi_2$, any one of which, including mixtures of two or more, may be used for the purposes of the invention. Similarly, tantalum forms $Ta_5Si_3$ and $TaSi_2$, either or both being suitable constituents of the compositions of the invention.

The powdered mixture charged to the heated crucible generally comprises tantalum silicide and chromium silicide in a ratio of 0.5 to 5 parts by weight of tantalum silicide to each part of chromium silicide. It does not necessarily follow, however, that the ratio charged to the crucible is indicative of the ratio deposited on a substrate. Some fractionation of the two is virtually unavoidable in the vaporization, per se, and further changes in the ratio of silicides is known to occur due to differences in their vaporization temperature and sticking probability for particular substrate surfaces.

The resistivity of a chromium silicide-tantalum silicide film may be increased more than ten fold by the addition of up to 50 percent alumina by weight, based on the total weight of the mixture charged to the crucible. Such increases in resistivity are achieved without excessive increases in the temperature coefficient of resistivity (TCR). Specifically, a 300 A. film deposited from a powder comprising 30 percent alumina and having a 3:1 ratio of tantalum silicide to chromium silicide was found to have a sheet resistance of 5000 ohms per square, and a TCR of —300 parts per million per degree centigrade. Thus, for embodiments wherein an alumina-comprising powder is charged, the composition to be vaporized includes from 1% to 65% alumina, from 10% to 80% chromium silicide, and from 5% to 50% tantalum silicide, all percentages by weight.

The drawing

Figure 2:
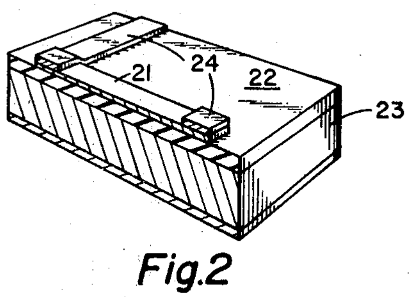
Figure 3:
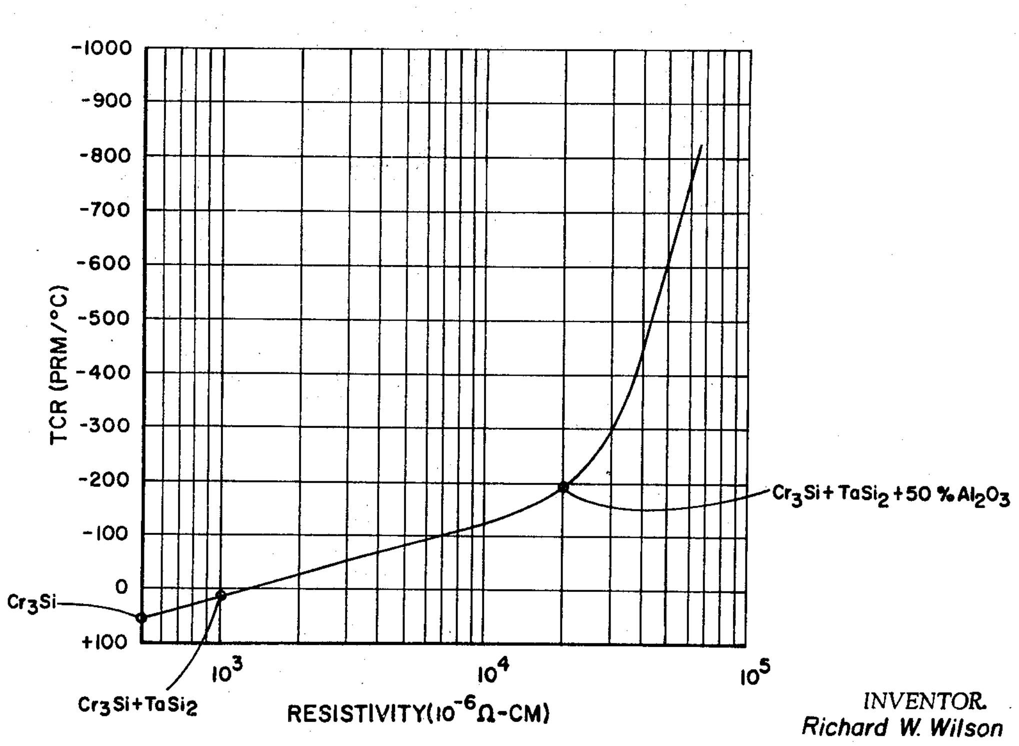

FIG. 1 is a schematic diagram of the flash evaporation system used in accordance with the invention;

FIG. 2 is a schematic perspective view showing the thin film resistor of the invention integrated with a silicon wafer containing diffused active surface components; and FIG. 3 is a plot of resistivity versus TCR (temperature coefficient of resistivity) for a series of thin films of the invention, beginning with pure chromium silicide, progressing through chromium silicide plus tantalum silicide, and then with increasing amounts of aluminum oxide added to the mixture of silicides.

In FIG. 1 crucible 11 consisting of a tungsten disc rests in a water-cooled holder 12 and is bombarded from below by electron beam 13, to generate a temperature from 2100° to 2500° C. The beam current under typical conditions is adjusted from 200 ma. to 400 ma. At 10 kv. and 400 ma. the temperature of the crucible is approximately 2500° C.

A cermet powder consisting of a mixture of three constituents, $Cr_3Si$, $TaSi_2$, and $Al_2O_3$, is loaded into a hopper with motor driven auger feed 14. Rotation of the auger then drops the cermet granules onto the heated tungsten disc, resulting in flash evaporation. Other systems for feeding the mixture of powders may be used; however, the auger type has been found preferable primarily because it does not permit a segregation of the powder types.

Substrate holder 15 consists of a copper, mica and stainless steel sandwich capable of generating temperatures up to 500° C., and is usually operated within 350° C. to 450° C. The temperature is measured by a thermocouple embedded in the wafer backup plate. The silicon wafers and associated monitoring substrates may be clamped to the heater with small wire springs.

Two monitoring systems are used to control the depositions. A quartz crystal oscillator 16 is exposed to the evaporant and a desired rate is set by adjusting the powder feed rate and the electron beam current. Shutter 17 is then opened and the deposition takes place on the silicon substrates and on a conventional conductance monitor. When the monitor indicates a predetermined conductance value the shutter is closed and the powder feed and the electron gun are turned off.

Configuration of a desired film geometry is accomplished by a reverse masking procedure, because the film itself has been found practically impossible to etch. First, aluminum, for example, is deposited on the oxidized silicon substrate, and is then photoresisted and etched so that openings down to the $SiO_2$ layer are formed. After deposition of the silicide film the surrounding aluminum is removed along with the unwanted portion of the film leaving the desired resistor geometry on the substrate. Aluminum or other suitable contact metal is then deposited on the resistor and subsequently etched to provide the desired connection pattern.

In FIG. 2 thin film resistance element 21 is shown deposited on silicon dioxide glass layer 22 which in turn is deposited or grown on silicon substrate 23. Electrical connection to the resistance element is made by means of aluminum metallization 24.

In FIG. 3 the point designated "$Cr_3Si$" indicates the resistivity and TCR of a film resulting from the flash vaporization of pure $Cr_3Si$; and the point "$Cr_3Si+TaSi_2$" corresponds to a film resulting from the flash vaporization of a mixture comprising 7 parts by weight $TaSi_2$ to 3 parts $Cr_3Si$. Films of increasing resistivity were obtained, as indicated by the curve, upon the addition of increasing amounts of alumina to the 7:3 mixture of tantalum and chromium silicides. With a starting mixture of 50% alumina, 35% tantalum silicide and 15% chromium silicide, by weight, a film was obtained having a resistivity of 20,000 $\mu\Omega$-cm. and a TCR of $-190$ p.p.m./° C., as indicated in FIG. 3. The process conditions used in vaporizing the 50% $Al_2O_3$ composition included a crucible temperature 2500° C. achieved using an electron beam current of 400 ma. at 10 kv. The substrate was an oxidized silicon wafer held at 400° C., and at a distance of 13 inches from the crucible. The cermet powder was charged to the crucible at 32 mg. per minute. The pressure on the system was held at about $2\times10^{-5}$ torr.

Although the term "crucible" generally denotes a refractory vessel having a cup-like or similar geometry, for the purposes of the present disclosure a crucible is understood to be any refractory surface, regardless of shape, capable of withstanding the temperatures necessary to vaporize the cermet powders of the invention, for example about 2500° C., without softening or chemically reacting with the powders. A flat surface as indicated in FIG. 1 is suitable. Tantalum and tungsten have been used successfully with tungsten being preferred.

Although a primary object of the invention is to provide resistance compositions especially suited for thin film deposition on silicon dioxide surfaces of microelectronic semiconductor structures, the compositions also have general utility in the fabrication of thin film resistors of all sizes, and may readily be deposited on other substrates, including for example alumina ceramic plate.

A "thin" film for the purposes of this disclosure denotes a thickness within the range of 5 to 10,000 angstroms. It is within the scope of the invention, however, to provide thicker films if desired.

I claim:

1. An electrical resistance element comprising a film deposited on a dielectric substrate, said film comprising a chromium silicide and a tantalum silicide.

2. An electrical resistance element comprising a film deposited on a dielectrical substrate, said film comprising a chromium silicide, a tantalum silicide, and aluminum oxide.

3. A composition of matter comprising about 10 to 80 weight percent chromium silicide, about 5 to 50 weight percent tantalum silicide and about 1 to 65 weight percent aluminum oxide.

References Cited

UNITED STATES PATENTS 3,205,087 9/1965 Allen ------------ 117—106 X

OTHER REFERENCES

Holland: Thin Film Microelectronics, 1965, pp. 149 and 153 to 155 relied upon.

Powell et al.: Vapor Deposition, Nov. 10, 1966, pp. 229, 271 and 272 relied upon.

Layer: Trans. 6th Nat'l Vac. Symp., 1959, pp. 210–214 relied upon.

ANDREW G. GOLIAN, Primary Examiner

U.S. Cl. X.R.

106—286; 117—106, 169; 252—518